(12) United States Patent
Woodmansee et al.

(10) Patent No.: US 9,946,658 B2
(45) Date of Patent: Apr. 17, 2018

(54) MEMORY INTERFACE DESIGN HAVING CONTROLLABLE INTERNAL AND EXTERNAL INTERFACES FOR BYPASSING DEFECTIVE MEMORY

(71) Applicant: Nvidia Corporation, Santa Clara, CA (US)

(72) Inventors: Michael Asbury Woodmansee, Lighthouse Point, FL (US); J. Arjun Prabhu, Palo Alto, CA (US)

(73) Assignee: NVIDIA Corporation, Santa Clara, CA (US)

( * ) Notice: Subject to any disclaimer, the term of this patent is extended or adjusted under 35 U.S.C. 154(b) by 130 days.

(21) Appl. No.: 14/088,039

(22) Filed: Nov. 22, 2013

(65) Prior Publication Data

US 2015/0149713 A1 May 28, 2015

(51) Int. Cl.
*G06F 12/08* (2016.01)
*G06F 12/0895* (2016.01)
*G06F 11/16* (2006.01)
*G11C 29/00* (2006.01)
*G06F 11/20* (2006.01)
*G11C 29/04* (2006.01)
*G11C 29/44* (2006.01)

(52) U.S. Cl.
CPC .......... *G06F 12/0895* (2013.01); *G06F 11/16* (2013.01); *G06F 11/1666* (2013.01); *G11C 29/76* (2013.01); *G06F 11/20* (2013.01); *G11C 2029/0409* (2013.01); *G11C 2029/4402* (2013.01); *Y10T 29/41* (2015.01)

(58) Field of Classification Search
CPC .. G06F 12/08; G06F 12/0888; G06F 12/0895; G06F 11/00; G06F 11/22; G11C 29/04; G11C 29/0401; G11C 29/0403
See application file for complete search history.

(56) References Cited

U.S. PATENT DOCUMENTS

| | | | |
|---|---|---|---|
| 4,943,966 A * | 7/1990 | Giunta | G06F 12/0676 |
| | | | 711/E12.088 |
| 5,058,115 A * | 10/1991 | Blake | G06F 11/1052 |
| | | | 714/767 |
| 5,867,511 A * | 2/1999 | Arimilli | G06F 11/1064 |
| | | | 711/113 |
| 6,041,390 A * | 3/2000 | Liu | G06F 12/121 |
| | | | 711/110 |
| 6,323,860 B1 | 11/2001 | Zhu | |
| 6,344,852 B1 | 2/2002 | Zhu | |
| 6,380,935 B1 | 4/2002 | Heeschen | |
| 6,400,619 B1 * | 6/2002 | Hsu | G11C 29/24 |
| | | | 365/189.07 |
| 6,437,780 B1 | 8/2002 | Baltaretu | |
| 6,535,209 B1 | 3/2003 | Abdalla | |

(Continued)

*Primary Examiner* — Michael Krofcheck
(74) *Attorney, Agent, or Firm* — Zilka-Kotab, PC

(57) ABSTRACT

An improved memory interface design is provided. In some implementations, an integrated circuit includes a first cache memory unit, a second cache memory unit located in parallel with the first cache memory unit, and a floorsweeping module configured to be able to select between the first cache memory unit and the second cache memory unit for cache requests, wherein the selection is based at least partially on the presence or absence of one or more manufacturing defects in the first cache memory unit or the second cache memory unit.

5 Claims, 7 Drawing Sheets

(56) References Cited

U.S. PATENT DOCUMENTS

| | | |
|---|---|---|
| 6,636,212 B1 | 10/2003 | Zhu |
| 6,657,635 B1 | 12/2003 | Hutchins |
| 6,697,063 B1 | 2/2004 | Zhu |
| 6,856,320 B1 | 2/2005 | Rubinstein |
| 6,879,207 B1 | 4/2005 | Nickolls |
| 7,102,646 B1 | 9/2006 | Rubinstein |
| 7,114,026 B1* | 9/2006 | Khanna ............... H04L 45/7453 365/49.18 |
| 7,170,515 B1 | 1/2007 | Zhu |
| 7,477,091 B2 | 1/2009 | Nickolls |
| 7,478,289 B1 | 1/2009 | Tamasi |
| 7,598,958 B1 | 10/2009 | Kelleher |
| 7,622,947 B1 | 11/2009 | Danskin |
| 7,631,152 B1 | 12/2009 | Alfieri |
| 7,633,505 B1 | 12/2009 | Kelleher |
| 7,664,905 B2 | 2/2010 | Jarosh |
| 7,664,907 B1 | 2/2010 | Hutsell |
| 7,685,371 B1 | 3/2010 | Nuechterlein |
| 7,849,332 B1 | 12/2010 | Alben |
| 7,882,369 B1 | 2/2011 | Kelleher |
| 7,886,164 B1 | 2/2011 | Alben |
| 8,131,770 B2 | 3/2012 | Gruenschloβ |
| 8,249,819 B1 | 8/2012 | Treichler |
| 8,471,845 B1 | 6/2013 | Stich |
| 2002/0188797 A1* | 12/2002 | Hsu .................... G06F 12/0893 711/104 |
| 2003/0005225 A1* | 1/2003 | Smits ................. G06F 12/0895 711/119 |
| 2004/0025095 A1* | 2/2004 | Nemani ............... G11C 29/808 714/710 |
| 2004/0111561 A1* | 6/2004 | Klein .................. G06F 12/0886 711/118 |
| 2004/0117694 A1* | 6/2004 | Howlett .............. G11C 29/848 714/710 |
| 2004/0164334 A1* | 8/2004 | Masleid ............. G06F 12/0893 711/E12.041 |
| 2006/0055695 A1 | 3/2006 | Abdalla |
| 2006/0071701 A1 | 4/2006 | Nickolls |
| 2006/0209078 A1* | 9/2006 | Anderson ............. G06T 15/005 345/506 |
| 2007/0101194 A1* | 5/2007 | Lockwood .......... G06F 11/2236 714/30 |
| 2008/0109613 A1 | 5/2008 | Jarosh |
| 2008/0270703 A1* | 10/2008 | Henrion .............. G06F 11/1064 711/128 |
| 2010/0131812 A1* | 5/2010 | Mohammad .......... G11C 29/44 714/723 |
| 2010/0295155 A1 | 11/2010 | Tsu |
| 2011/0126056 A1 | 5/2011 | Kelleher |
| 2011/0291748 A1 | 12/2011 | Li |
| 2012/0213450 A1 | 8/2012 | Shirley |
| 2012/0246379 A1 | 9/2012 | Kelleher |
| 2013/0033507 A1 | 2/2013 | Garanzha |
| 2013/0249915 A1 | 9/2013 | Stich |
| 2014/0344641 A1* | 11/2014 | Jeong .................... G06F 11/073 714/759 |

* cited by examiner

MEMORY INTERFACE DESIGN HAVING CONTROLLABLE INTERNAL AND EXTERNAL INTERFACES FOR BYPASSING DEFECTIVE MEMORY

BACKGROUND

This application relates generally to electronic circuitry and more particularly to processor memory architectures and interfaces. Integrated circuits are created through a process known as semiconductor device manufacture. Semiconductor device manufacturing is a multi-step manufacturing sequence using a variety of chemical, physical, and photolithographic processing steps. As semiconductor manufacturing technology has improved, the complexity of the processing steps has increased and the feature size used on the integrated circuits has decreased. As complexity increases and feature size decreases, the number of manufacturing defects on a given integrated circuit tends to increase. The proportion of integrated circuits on a production wafer that perform properly is referred to as the yield. To the extent that a manufacturing defect causes one or more integrated circuits on a production wafer to be partially or fully non-functional, that defect adversely affects the yield. As the yield for a semiconductor production process decreases, the cost per manufactured integrated circuit increases. Techniques that increase the semiconductor production process yield are desirable.

SUMMARY

In some implementations, there is provided an integrated circuit including a first cache memory unit, a second cache memory unit located in parallel with the first cache memory unit; and a floorsweeping module configured to be able to select between one or both of the first cache memory unit and the second cache memory unit for cache requests, wherein the selection is based at least partially on the presence or absence of one or more manufacturing defects in the first cache memory unit or the second cache memory unit.

Some implementations include a defect indicator coupled to the floorsweeping module and configured to indicate the presence or absence of the one or more manufacturing defects. The defect indicator may include a plurality of production fuses. The integrated circuit may also include a graphics processing unit. The integrated circuit may also include a memory interface coupled to the first cache memory unit and the second cache memory unit. In some implementations, the memory interface may include a random access memory interface configured to communicate with a random access memory external to the integrated circuit. The integrated circuit may also include a processing core coupled to the first cache unit or the second cache unit. The first cache unit and the second cache unit may be a raster operation pipeline module. Some implementations may also include clamping circuitry capable of clamping the output of a defective cache memory unit.

Some implementations may include a method of manufacturing including first fabricating a first memory storage cluster; then fabricating a second memory storage cluster, and then fabricating selection circuitry coupled to the first memory storage cluster and the second memory storage cluster, wherein the selection circuitry is configured to be able to bypass the first memory storage cluster or the second memory cluster based on one or more indicators of a manufacturing defect. Some implementations of this aspect include corresponding computer systems, apparatus, and computer programs recorded on one or more computer storage devices, each configured to perform the actions of the methods.

Some implementations of this method may include fabricating defect indication circuitry coupled to the selection circuitry, wherein the defect indication circuitry is configured to indicate the presence of the manufacturing defect. In some implementations, fabricating the defect indication circuitry includes fabricating one or more production fuses that indicate the presence of a defect. Fabricating the first memory storage cluster may also include fabricating a cache memory. Fabricating the first memory storage cluster may include fabricating an operational unit coupled to the cache memory. Fabricating may also include fabricating an operational unit that includes a computational unit capable of graphical display calculations.

Some implementations include a system having at least two independently selectable memory clusters and an interface circuit coupled to the two independently selectable memory clusters, wherein the interface circuit is configurable to route memory requests to at least one of the memory clusters based at least partially on a defect indicator associated with one or more of the independently selectable memory clusters. Some implementations of this aspect include multiplexor circuitry coupled to the memory clusters. The two independently selectable memory clusters may also include a cache memory. The two independently selectable memory clusters can include a raster operations pipeline module. Implementations may further include one or more external storage units coupled to the interface circuit the one or more external storage units includes dynamic random access memory.

DETAILED DESCRIPTION

In a typical semiconductor manufacturing process, some percentage of manufactured integrated circuits will have manufacturing defects. A manufacturing defect within a particular portion or region of an integrated circuit can render that portion or region or, in fact, the entire integrated circuit non-functional. A non-functional integrated circuit reduces the yield from the semiconductor manufacturing process and increases the cost of both the process and the cost of each functional integrated circuit. Accordingly, it is desirable to reduce the number and frequency of defects and to develop techniques to reclaim or otherwise make functional integrated circuits that have manufacturing defects.

One technique for increasing semiconductor manufacturing yield is known as "floorsweeping." "Floorsweeping" is a process or technique by which manufacturing defects or other errors present in integrated circuits can be disabled and/or bypassed such that the integrated circuit maintains either some or all of its designed functionality. A floorsweeping module includes circuitry that is able to implement floorsweeping on an integrated circuit. One or more of the examples set forth below advantageously enables an integrated circuit, such as a GPU or CPU, to maintain a consistently sized external memory interface despite one or more manufacturing defects within a memory cluster on an integrated circuit.

Figure 1:
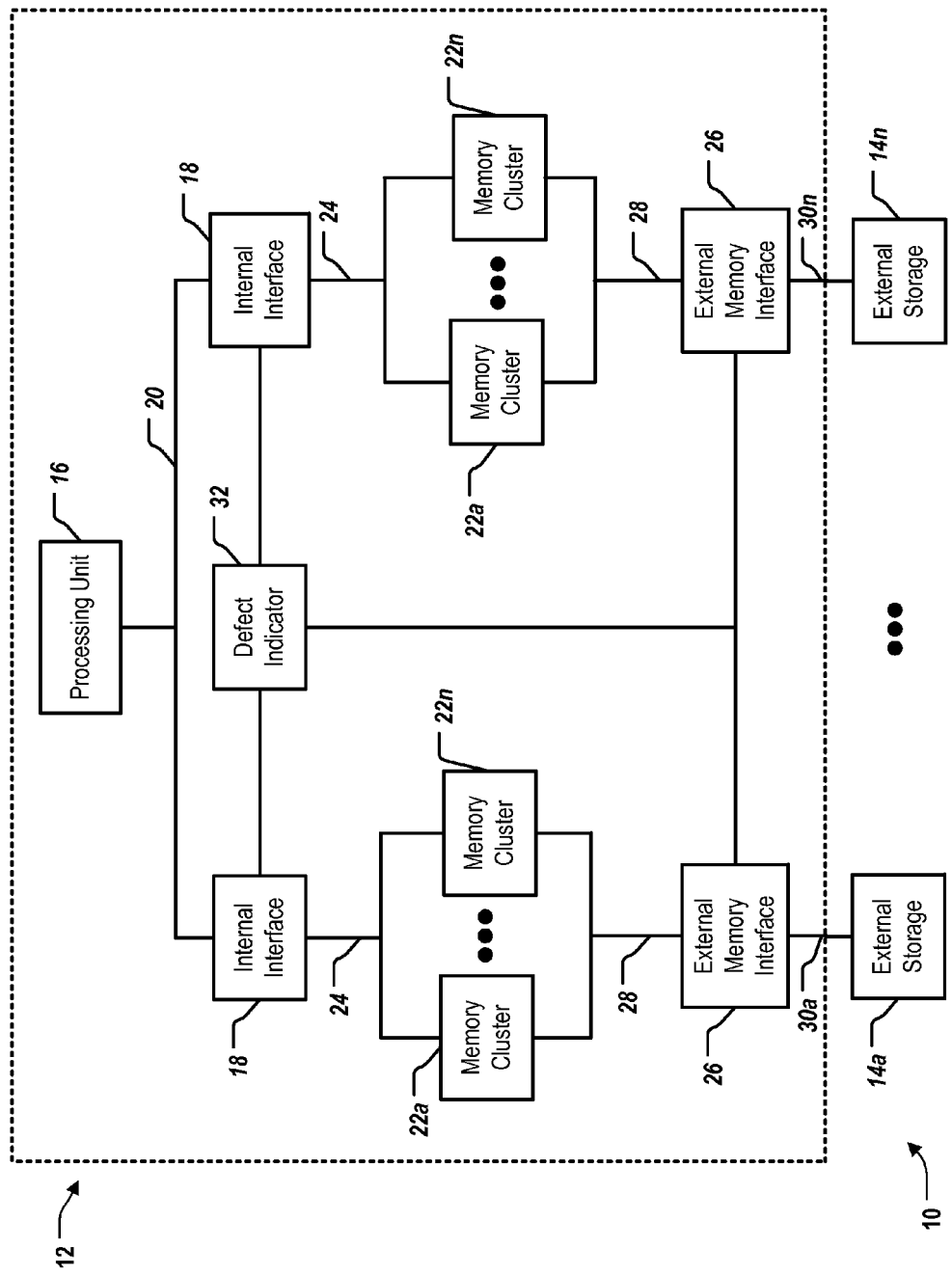
FIG. 1 is a block diagram of an example system in accordance with example embodiments of the present invention.

FIG. 1 depicts a block diagram of an example system 10, in accordance with implementations of the present disclosure. In some implementations, the system 10 may include an integrated circuit 12 and one or more external storage devices 14. In some implementations, the integrated circuit 12 may include a graphics processor or graphics processing unit ("GPU"). In some implementations, the integrated circuit 12 may include multiple processing units. In some implementations, the integrated circuit includes a plurality of shader modules and/or rasterization modules.

In still other implementations, the integrated circuit 12 may be a general purpose processor, such as a CPU, or another form of specialized processor or processing unit, such as an application specific integrated circuit ("ASIC"). While the integrated circuit 12 is depicted in FIG. 1 as including various subcomponents, it will be appreciated that the depiction of FIG. 1 is an example and in various implementations, additional or alternative circuit structures and components may be employed. For example, in some implementations, the integrated circuit 12 may include additional structures not depicted in FIG. 1. The integrated circuit 12 may also include multiple separate integrated circuits or components electrically coupled together.

The processing unit 16 may include one or more circuit components capable of processing instructions or data. For example, in one implementation, the processing unit includes one or more GPU or CPU cores. The processing unit 16 may also include one or more microprocessors. In various implementations, the processing unit 16 is able to execute one or more threads as part of a multi-thread computing system. The processing unit 16 may include an internal memory or cache such as a Level 1 ("L1") cache.

Processing unit 16 may be coupled ("electrically connected either directly or indirectly") to one or more internal interfaces 18 via a bus 20. The internal interface 18 may provide an interface and communication path between the processing unit 16 and storage and/or additional computational resources on the integrated circuit 12. In some implementations, the internal interface may include one or more than one switch, such as a crossbar switch. For example, the internal interface 18 may include main crossbar or a control signal crossbar for the integrated circuit 12. An example internal interface 18 is described in greater detail in relation to FIG. 4. While the internal interface 18 is depicted in FIG. 1 as two distinct boxes, this depiction is representative. In some implementations, for example, the internal interface may include a single crossbar fabric coupled to multiple groups of memory clusters 22a-22n.

The bus 20 includes an electrical connection, either direct or indirect, between the processing unit 16 and the internal interface 18. In various implementations, the bus 20, like the other buses described below, may consist of a given number of parallel electrical pathways within the integrated circuit. Typical bus widths range from 8 bits to 128 bits, but any size bus may be selected including a single bit serial connection. In some implementations, the bus 18 may not be required. For example, a bus 20 may not be employed where the internal interface 18 includes a crossbar switch.

As shown in FIG. 1, the internal interface 18 may couple the processing unit 16 to a plurality of memory clusters 22a-22n via a bus 24. As described in greater detail below in regard to FIG. 2, the memory clusters 22a-22n may include one or more memories, such as the cache memory, and/or one or more functional or operational components. In some implementations, the memory clusters 22a-22n include a Level 2 ("L2") cache capable of being used in conjunction with the processing unit 16. The memory clusters 22a-22n may be arrayed in parallel electrically such that one or more of the memory clusters 22a-22n may be interfaced independently by the components of the integrated circuit 12. For example, the internal interface 18 may be configured to access one or more of the memory clusters 22a-22n while not accessing one or more other memory cluster 22a-22n.

The memory clusters 22a-22n may be coupled to one or more external memory interfaces 26 via a bus 28. As described in greater detail below with regard to FIG. 3, the external memory interfaces 26 may couple the integrated circuit 12 (and thus the processing unit 16) to one or more of the external storage devices 14a-14n via the buses 30a-30n. In various implementations, the buses 30a-30n may include one or more external contact pins or bumps that electrically carry electrical signals between the integrated circuit 12 and the external storage devices 14a-14n. In some implementations, each of the buses 30a-30n includes a 64 bit DRAM bus, and the integrated circuit 12 includes four buses 30 (each coupled to a plurality of memory clusters 22a-22n) for a total DRAM bus width of 256 bits. Advantageously, some implementations enable floorsweeping of the memory clusters 22a-22n to enable the integrated circuit 12 to maintain the 256-bit DRAM bus width despite one or more manufacturing defects within the memory clusters 22a-22n. In the way, some implementations are able to maintain a full bandwidth memory interface despite manufacturing errors that previously could reduce the bandwidth and/or memory capacity of an integrated circuit. In various other implementations, other bus widths or bus numbers may employed depending on the input/output requirements of the external storage device 14.

External storages 14a-14n may include any form of physical device that is capable of storing programs or data on a temporary or permanent basis. In some implementations, the external storage 14 includes a random access memory, such as a dynamic random access memory ("DRAM"). In some implementations, other suitable forms of memory may be used, including SRAM, EEPROM, and/or flash memory. In some implementations, the external storages 14a-14n includes computer memory that is used as a frame buffer by the processing unit 16 and/or the integrated circuit 12.

The integrated circuit 12 may also include a defect indicator 32. The defect indicator 32 provides an indication of one or more defective or partially defective memory clusters 22. In some implementations, the defect indicator 32 may include one or more fuses that may be blown during manufacture or testing of the integrated circuit 12 to indicate the presence of defects within one or more of the memory clusters 22. In some implementations, the defect indicator 32 may include another form of indicative circuitry, such as one or more registers and/or a computer memory, such as a read-only memory ("ROM"), configured to store an indicator of one or more defective memory clusters 22.

Figure 2:
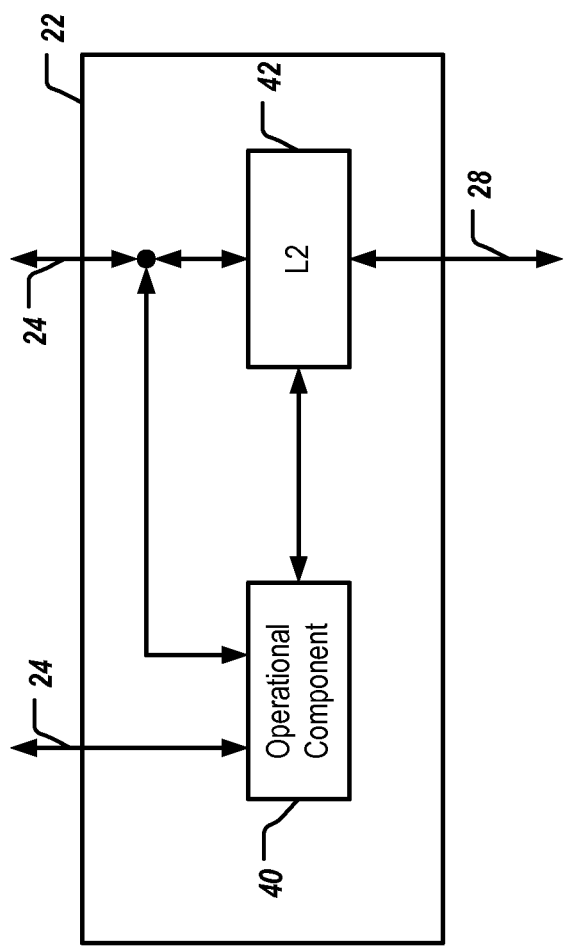
FIG. 2 is a block diagram of an example memory cluster in accordance with example embodiments of the present invention.

FIG. 2 depicts a block diagram of an example memory cluster 22 in accordance with example implementations of the present disclosure. In some implementations, the memory cluster 22 may include an operational component 40 and an L2 cache component 42. In some implementations, the operational component 40 or the L2 cache component 42 may be absent. For example, the memory cluster 22 in some implementations may not include the operational component 40 or may not include the L2 cache component 42. Accordingly, the name "memory cluster" is not intended indicate a requirement that a memory be included within the memory cluster 22a-22n although the L2 memory included in the memory cluster 22 of FIG. 2.

The L2 cache 42 may include any form of semiconductor cache or semiconductor memory. As noted above, in various implementations, the L2 cache 42 includes an L2 cache for the processing unit 16. In various implementations, the L2 cache is configured to perform a caching function for external memory. As shown, the L2 cache 42 may be coupled to the external memory interface 26 via the bus 28. In some implementations, the L2 cache 42 may be replaced with or used in conjunction with another type of cache memory and/or another form of semiconductor computer memory.

The operational component 40 may include processing or computational circuitry that may receive instructions or assignments from the processing unit 16. In some implementations, the operational component 40 includes a raster operations pipeline ("ROP") module. The ROP module may be configured to process picture elements ("pixel") and or texture elements ("texel"). For example, in some implementations, the operational component 40 may include a ROP configured to calculate pixel color and/or pixel depth values. In some implementations, the operational component 40 may include a cache controller.

Figure 3:
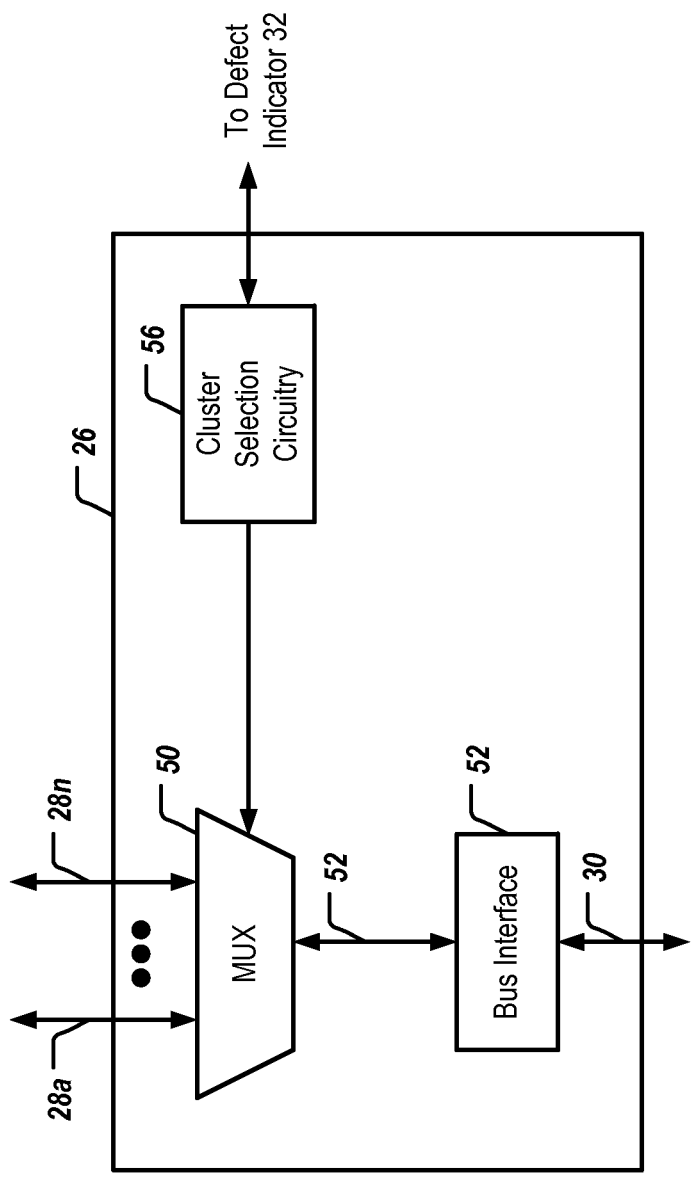
FIG. 3 is a block diagram of an example external memory interface in accordance with example embodiments of the present invention.

FIG. 3 shows the example external memory interface 26, in accordance with example implementations of the present disclosure. The external memory interface 26 may include a multiplexer ("MUX") 50, a bus interface 52, and cluster selection circuitry 56. MUX 50 includes circuitry that is able to select one of several inputs or outputs and forward signals on those inputs or outputs into a single input or output. For example, in the external memory interface 26, the example MUX 50 is able to receive signals from memory clusters 22a-22n over buses 28a-28n, and forward select signals from one or more of the memory clusters 22a-22n to bus 30. Conversely, the MUX 50 is able to receive signals over bus 54 and forward those signals to one or more of the memory clusters 22a-22n over one or more of buses 28a-28n. In this way, the MUX 50 may enable a single bus interface 52 to communicate with multiple memory clusters 22a-22n. In some implementations, the MUX 50 may be replaced or supplemented by any suitable form of multiple input single output and/or multiple output single input switching. For example, in various implementations, the MUX 50 may be replaced by a 2-to-1 switch, an n-to-1 switch, a crossbar switch, a cross-point switch, a matrix switch, a rotary switch, and/or a crossover switch.

The MUX 50 may be coupled to cluster selection circuitry 56. The cluster selection circuitry 56 may be configured to control the operation of the MUX 50 using one or more control signals. In this way, the cluster selection circuitry may be configured to direct the MUX 50 to couple the bus interface 52 to one or more of the buses 28a-28n. For example, in some implementations, the cluster selection circuitry 56 may be configured to instruct the MUX 50 to couple the bus interface 52 to buses 28a-28n which are connected to functional memory clusters 28a-28n and to not couple the bus interface 52 to buses 28a-28n that are coupled to memory clusters that are non-functional. In further example, in some implementations having two memory clusters 22a and 22b coupled to each external memory interface 26 and where one example memory cluster 22b has a defect rendering it non-functional, the cluster selection circuitry 56 may be configured to instruct the MUX 50 to couple the bus interface 52 only to the memory cluster 22a. In this way, the presence of a manufacturing defect within memory cluster 22b does not render the external memory interface 26 non-functional and the integrated circuit's external memory bandwidth is not degraded by the presence of the manufacturing defect within memory cluster 22b.

The cluster selection circuitry 56 may be coupled to the defect indicator 32. As described above, the cluster selection circuitry 56 may be configured to access the defect indicator 32 to determine which memory clusters 22a-22n—if any—have manufacturing or other defects. In some implementations, the cluster selection circuitry 56 may employ other suitable techniques to determine which—if any—of the memory clusters 22a-22n are non-functional.

In some implementations, the external interface 26 and/or the cluster selection circuitry may not be coupled to the defect indicator 32. For example, as described further below, the internal interface 18 may be configured to bypass a defective memory cluster 22a-22n by avoiding use of physical memory addresses located with the defective memory cluster. In such implementations, the external interface 26 would bypass the defective memory cluster 22a-22n automatically since no memory requests to that memory cluster would be generated.

The external memory interface 26 may also include a bus interface 52, which is circuitry configured to couple the external memory interface and thus the integrated circuit 12 to the external storage 14. In various implementations, the bus interface 52 may include input/output buffers, input/output drivers, termination circuitry. The bus interface 52 may be coupled to one or more external pins or bumps that make up the bus 30. In some implementations, the external memory interface 26 may also include clamping circuitry capable of clamping the output from any of the memory clusters 22a-22n determined to be defective. In some implementations, the clamping circuitry may be located elsewhere on the integrated circuit 12.

Figure 4:
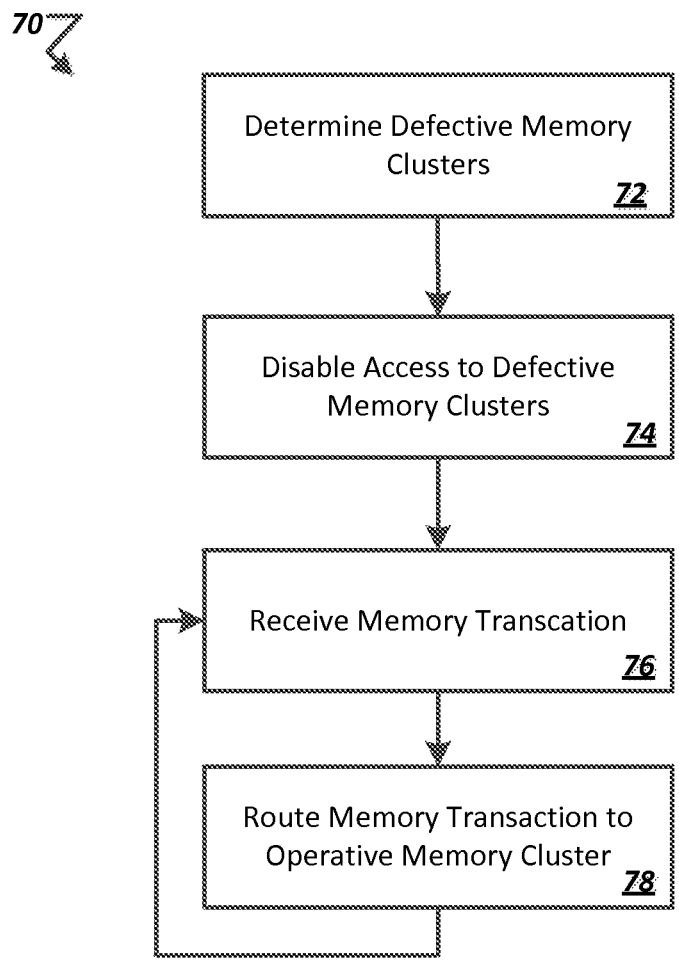
FIG. 4 is a flow diagram of an example floorsweeping process in accordance with example embodiments of the present invention.

The example cluster selection circuitry 56 may be configured to perform the example flow 70 set forth in FIG. 4. For example, as indicated by block 72 of FIG. 4, the cluster selection circuitry 56 may be configured to determine one or more defective memory clusters. In some implementations, the cluster selection circuitry may be configured to determine defective memory clusters by accessing the defect indicator 32. For example, the cluster selection circuitry may be configured to determine the state of one or more fuses that indicate whether one or more of the memory clusters 22a-22n are defective. In still other implementations, determining the defective memory clusters as set forth in block 72 may involve reading or accessing another suitable indicator or storage device, such as registers or a semiconductor memory.

After determining the defective memory clusters, the flow 70 may include disabling access to defective memory clusters. For example, in some implementations, as described above, the cluster selection circuitry 56 may be configured to instruct the MUX 50 to disable access or stop access to and from the bus interface 52 for any buses 28a-28n that are coupled to memory clusters 22a-22n that are defective and/or non-functional. In some implementations, the cluster selection circuitry may be configured to disable access to the defective memory clusters by excluding the addresses within the defective memory clusters from the addressable address space. In such implementations, the defective memory clusters would be logically disabled as no memory transactions would be initiated for the memory within the defective memory cluster.

After disabling access to the defective memory clusters, the flow 70 next includes receiving a memory transaction from the external storages 14a-14n over the bus 30. In some implementations, receiving a memory transaction may include receiving stored data or instructions to be loaded into the L2 cache 42 within the memory cluster 22a-22n.

After receiving the memory transaction, the flow 70 next includes routing memory transactions to one or more operative memory clusters 22a-22n within the integrated circuit 12. For example, if the external memory interface 26 is coupled to memory clusters 22a and 22b but access to memory cluster 22b was disabled due to a defect within memory cluster 22b, step 78 may include routing the memory transaction received from the external storage 14a through the MUX 50 to memory cluster 22a. If multiple memory clusters 22a though 22n are functional, the cluster selection circuitry 56 and the MUX 50 may route the memory transaction to any of the functional memory clusters 22a-22n or may employ any one of a number of memory preference or caching algorithms to determine which of multiple functional memory clusters 22a-22n to route the memory transaction.

Figure 5:
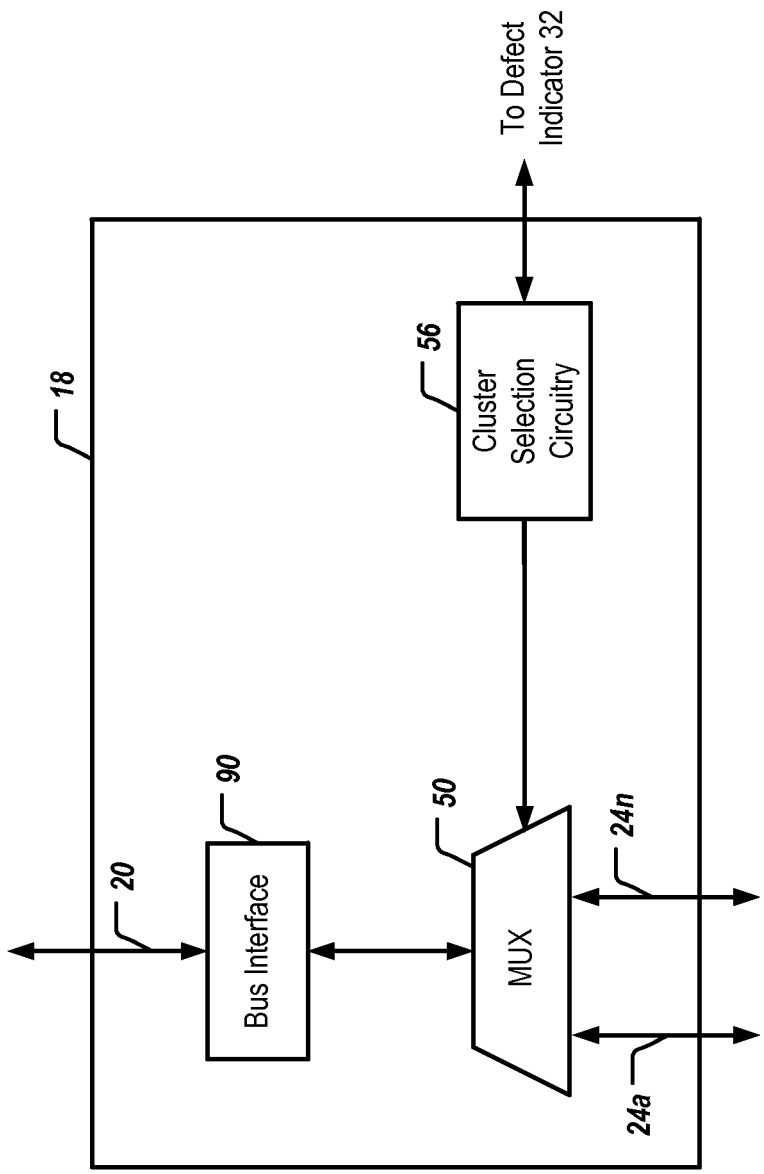
FIG. 5 is an example internal interface in accordance with example embodiments of the present invention.

Turning next to FIG. 5, an example internal interface 18 in accordance with example implementations of the present disclosure is shown. The internal interface 18 may include a MUX 50, cluster selection circuitry 56, and a bus interface 90. The MUX 50 and the cluster selection circuitry shown in FIG. 5 operate substantially similar to the MUX 50 and the cluster selection circuitry 56 described above in relation to FIG. 3, except that the MUX 50 and cluster selection circuitry 56 control the interface between the processing unit 16 via the bus interface 90 and the memory clusters 22a-22n rather than the connection between the external storage 14 and the memory clusters 22a-22n. As with the cluster selection circuitry 56 described above in relation to FIG. 3, the cluster selection circuitry 56 shown in FIG. 5 may be configured to execute the flow 70 depicted in FIG. 4. For example, the cluster selection circuitry 56 may be configured to: (a) determine defective memory clusters, (b) disable access to those defective memory clusters through commands sent to the MUX 50, (c) receive memory transactions from bus interface 90, such as memory reads or writes and/or data, and (d) to route those memory transactions to operative memory clusters 22a-22n. In addition, the internal interface 18 may be configured to receive memory transactions from one or more of the memory clusters 22a-22n over the buses 24a through 24n and to communicate those memory transactions to the processing unit 16 over the bus 20.

In some implementations, the cluster selection circuitry 56 and/or the internal interface 18 may be configured to disable access to the defective memory clusters 22a-22n by excluding memory locations within the defective memory clusters from the address space addressable by the processing unit 16 and/or the internal interface 18. While the defective memory cluster 22a-22n may remain physically connected to the internal interface 18 and/or the external interface 26, memory transactions would not be routed to it. In this way, a defective memory can also be logically disabled by the integrated circuit 12.

Figure 6:
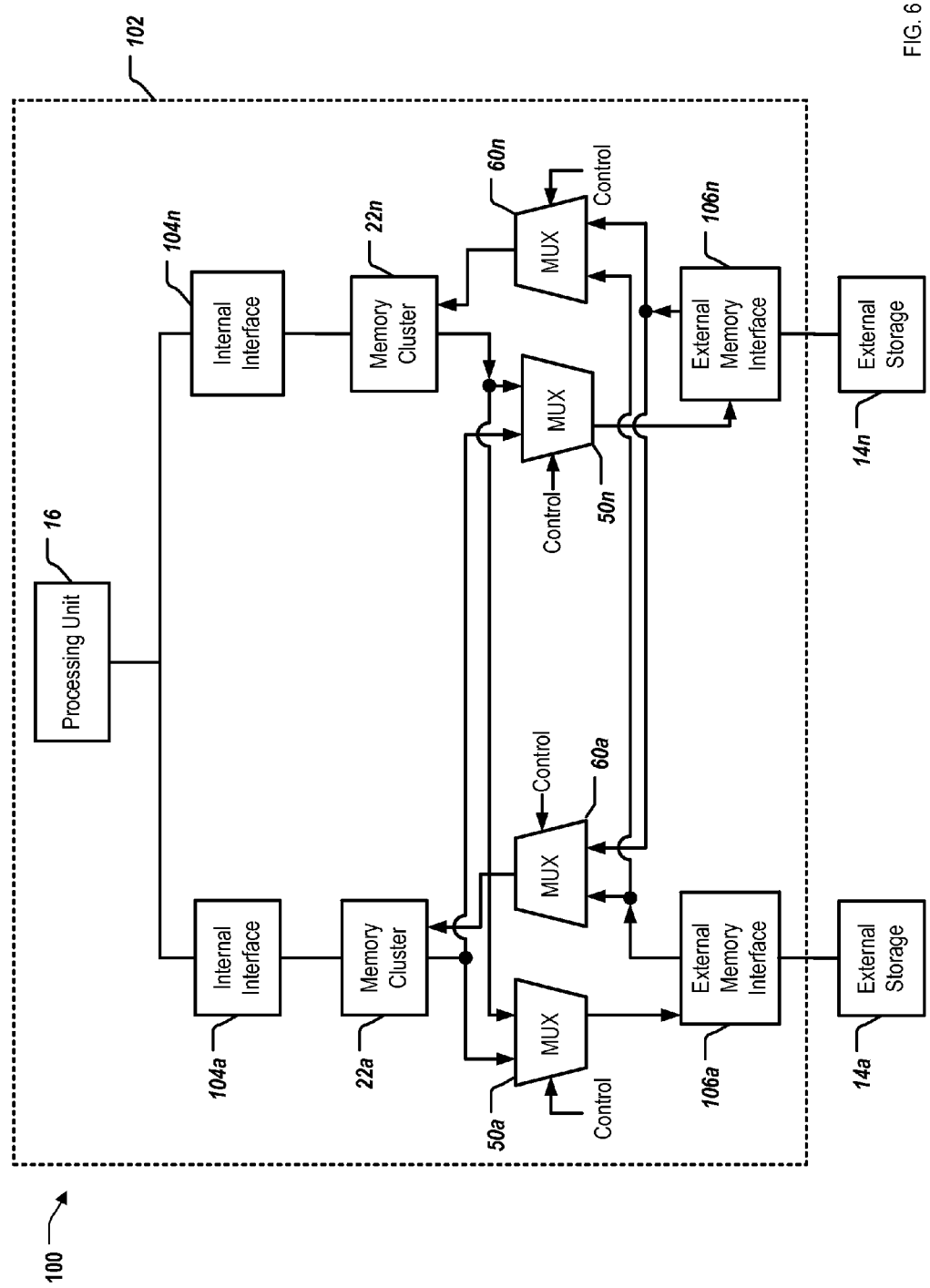
FIG. 6 is a block diagram of another example system in accordance with example embodiments of the present invention.

Turning next to FIG. 6, another example system 100 in accordance with example implementations of the present disclosure is shown. The system 100 may include an integrated circuit 102, which may include a processing unit 16 that is coupled to memory clusters 22a-22n via one or more internal interfaces 104a through 104n described above in relation to FIGS. 1 and 5. However, unlike the implementation shown in FIG. 1, the internal interfaces 104a through 104n are coupled to a single memory cluster 22a-22n, respectively. Each memory cluster 22a-22n may be correspondingly coupled to multiple MUXs 50a-50n and 60a-60n. For example, in some implementations, an output from the memory cluster 22a may be coupled to MUX 50a and 50n and the input to memory cluster 22a may be coupled to MUX 60a.

The MUXs 50a-50n and 60a-60n may be coupled to one or more external memory interfaces 106a-106n. For example, the external memory interface 106a may have an input coupled to the MUX 50a and its output coupled to the MUX 60a and the MUX 60n. As also shown in FIG. 6, each of the MUXs 50a-50n and 60a-60n may receive one or more control signals enabling them to select one or more input signals to forward to memory clusters 22a-22n and/or the external memory interfaces 106a-106n. In some implementations, the control signal may be provided by selection circuitry, such as the cluster selection circuitry 56 described in regards to FIGS. 3 and 5, based on a defect indicator (not shown in FIG. 6).

As shown in FIG. 6, the external memory interfaces 106a-106n are each coupled to external storages 14a-14n. The system 100 may be configured to activate the MUXs 50a-50n to selectively transmit memory transactions between the processing units 16/the memory clusters 22a-22n and the external storages 14. In this way, the MUXs 50a-50n and 60a-60n and the associated control circuitry may be configured to transmit signals from more than one external memory interface 106a-106n to a single memory cluster 22a-22n in the event of a defect within one or more of the memory clusters 22a-22n. For example, in the example system 100, if the memory cluster 22n is defective, the system 100 may be configured to control 50a-50n and 60a-60n such that memory transactions to and from both external storages 14a-14n are routed through the memory cluster 22a. In particular, the system 100 may disable 50n and 60n such that memory transactions from both external memory interface 106a and external memory interface 106n are routed through MUXs 50a and 60a and access memory cluster 22a. In this way, the system 100 is able to maintain two active bus connections (and a corresponding external bus width) to external storages 14 even when memory cluster 22n is defective.

Figure 7:
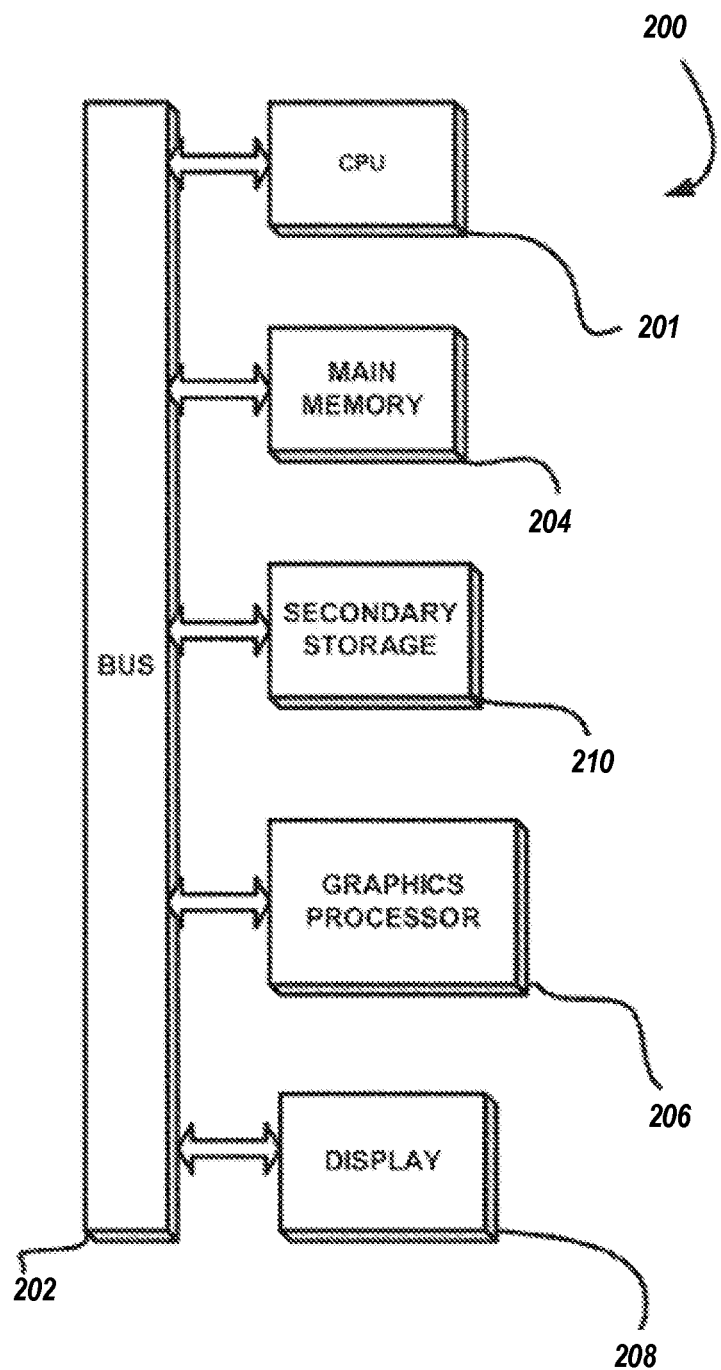
FIG. 7 depicts an example computing system for implementing the integrated circuits of FIGS. 1 and 6.

FIG. 7 depicts an example computing system 200 for implementing the integrated circuits 10 and/or the integrated circuit 102. Of course, the integrated circuits 12 and 102 may be implemented in any desired environment. As shown, the system 200 includes at least one CPU 201 which is connected to a communication bus 202. The system 200 also includes main memory 204 (for example, the storage device 14). The system 200 also includes a graphics processor 206 and a display 208. In some implementations, the graphics processor 206 may be the integrated circuit 12 or 102. Additionally, in some implementations, the architecture and/ or functionality of the various previous figures may be implemented on a system on chip or other integrated solution. For example, a CPU and GPU may be located on one integrated circuit. In some implementations, the graphics processor 206 may include a plurality of shader modules and/or rasterization modules. Each of the foregoing modules may even be situated on a single semiconductor.

The system 200 may also include a secondary storage 210. The secondary storage 910 includes, for example, a hard disk drive and/or a removable storage drive, representing a solid state drive, a magnetic tape drive, a compact disk drive, etc. The removable storage drive reads from and/or writes to a removable storage unit in a well-known manner.

Computer programs, firmware, or computer control logic algorithms, may be stored in the main memory 204 and/or the secondary storage 210. Such computer programs, when executed, enable the system 200 to perform various functions. Memory 204, storage 210 and/or any other storage are possible examples of computer-readable media. In some implementations, the stored computer programs, firmware, or computer control logic algorithms may be configured such that when executed they perform the flow 70.

In some implementations, the architecture and/or functionality of the various previous figures may be implemented in the context of the CPU 201, graphics processor 206, a chipset (for example, a group of integrated circuits designed to work and sold as a unit for performing related functions, etc.), and/or any other integrated circuit for that matter.

Still yet, the architecture and/or functionality of the various previous figures may be implemented in the context of a general computer system, a circuit board system, a game console system dedicated for entertainment purposes, an application-specific system, a mobile system, and/or any other desired system, for that matter. Just by way of example, the systems 10, 100, or 200 may include a desktop computer, lap-top computer, hand-held computer, mobile phone, personal digital assistant (PDA), peripheral (e.g. printer, etc.), any component of a computer, and/or any other type of logic. The architecture and/or functionality of the various previous figures and description may also be implemented in the form of a chip layout design, such as a semiconductor intellectual property ("IP") core. Such an IP core may take any suitable form, including synthesizable RTL, Verilog, or VHDL, netlists, analog/digital logic files, GDS files, mask files, or a combination of one or more forms.

While this document contains many specific implementation details, these should not be construed as limitations on the scope what may be claimed, but rather as descriptions of features that may be specific to particular implementations or embodiments. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can, in some cases, be excised from the combination, and the claimed combination may be directed to a sub combination or variation of a sub combination.

The invention claimed is:

1. An integrated circuit comprising:
   a processor;
   a first cache memory unit having a plurality of memory portions;
   a first internal interface that provides a first communication path between the processor and the first cache memory unit;
   a first external memory interface that provides a second communication path between an external storage device and the first cache memory unit; and
   a defect indicator configured to indicate a presence of a defect for each memory portion of the plurality of memory portions of the first cache memory unit by way of a state thereof; and
   wherein the first external memory interface includes:
      a first bus interface for receiving first signals from the external storage device,
      a first switch coupled to the first bus interface that is operable to selectively couple the first bus interface to each memory portion of the plurality of memory portions, and
      first selection circuitry coupled to the defect indicator and operable to:
         determine from the defect indicator which memory portions of the plurality of memory portions are indicated as having the defect, and
         control the first switch to couple the first bus interface only to memory portions of the plurality of memory portions that are not indicated by the defect indicator as having the defect, such that the first signals received by the bus interface from the external storage are forwarded through the first switch only to the memory portions of the plurality of memory portions that are not indicated by the defect indicator as having the defect;
   wherein the first internal interface includes:
      a second bus interface for receiving second signals from the processor,
      a second switch coupled to the second bus interface that is operable to selectively couple the second bus interface to each memory portion of the plurality of memory portions, and
      second selection circuitry coupled to the defect indicator and operable to:
         determine from the defect indicator which memory portions of the plurality of memory portions are indicated as having the defect, and
         control the second switch to couple the second bus interface only to memory portions of the plurality of memory portions that are not indicated by the defect indicator as having the defect, such that the second signals received by the second bus interface from the processor are forwarded through the second switch only to the memory portions of the plurality of memory portions that are not indicated by the defect indicator as having the defect.

2. The integrated circuit of claim 1, wherein the first cache memory unit comprises a raster operation pipeline module.

3. A method of manufacturing an integrated circuit comprising:
   fabricating a processor;
   fabricating a first cache memory unit having a plurality of memory portions;
   fabricating a first internal interface that provides a first communication path between the processor and the first cache memory unit;
   fabricating a first external memory interface that provides a second communication path between an external storage device and the first cache memory unit; and
   fabricating defect indication circuitry configured to indicate a presence of a defect for each memory portion of the plurality of memory portions of the first cache memory unit by way of a state thereof; and wherein the first external memory interface includes:
- a first bus interface for receiving first signals from the external storage device,
- a first switch coupled to the first bus interface that is operable to selectively couple the first bus interface to each memory portion of the plurality of memory portions, and
- first selection circuitry coupled to the defect indicator and operable to:
  - determine from the defect indicator which memory portions of the plurality of memory portions are indicated as having the defect, and
  - control the first switch to couple the first bus interface only to memory portions of the plurality of memory portions that are not indicated by the defect indicator as having the defect, such that the first signals received by the bus interface from the external storage are forwarded through the first switch only to the memory portions of the plurality of memory portions that are not indicated by the defect indicator as having the defect;

wherein the first internal interface includes:
- a second bus interface for receiving second signals from the processor,
- a second switch coupled to the second bus interface that is operable to selectively couple the second bus interface to each memory portion of the plurality of memory portions, and
- second selection circuitry coupled to the defect indicator and operable to:
  - determine from the defect indicator which memory portions of the plurality of memory portions are indicated as having the defect, and
  - control the second switch to couple the second bus interface only to memory portions of the plurality of memory portions that are not indicated by the defect indicator as having the defect, such that the second signals received by the second bus interface from the processor are forwarded through the second switch only to the memory portions of the plurality of memory portions that are not indicated by the defect indicator as having the defect.

4. The method of claim 3, wherein fabricating the first cache memory unit comprises fabricating a computational unit capable of graphical display calculations.

5. The integrated circuit of claim 1, wherein the memory portions of the plurality of memory portions that are indicated by the defect indicator as having a defect are defective memory portions, and wherein the internal interface is configured to disable access to the defective memory portions by excluding memory locations within the defective memory portions from address space addressable by the processor.

* * * * *